US012563719B2

(12) United States Patent
Kim et al.

(10) Patent No.: US 12,563,719 B2
(45) Date of Patent: Feb. 24, 2026

(54) INTEGRATED CIRCUIT DEVICE

(71) Applicant: Samsung Electronics Co., Ltd., Suwon-si (KR)

(72) Inventors: Yangdoo Kim, Suwon-si (KR); Sangwuk Park, Suwon-si (KR); Minkyu Suh, Suwon-si (KR); Geonyeop Lee, Suwon-si (KR); Dokeun Lee, Suwon-si (KR); Jungpyo Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 396 days.

(21) Appl. No.: 18/365,397

(22) Filed: Aug. 4, 2023

(65) Prior Publication Data

US 2024/0074163 A1 Feb. 29, 2024

(30) Foreign Application Priority Data

Aug. 25, 2022 (KR) ........................ 10-2022-0107177

(51) Int. Cl.
H10B 12/00 (2023.01)

(52) U.S. Cl.
CPC ......... H10B 12/488 (2023.02); H10B 12/315 (2023.02); H10B 12/485 (2023.02)

(58) Field of Classification Search
CPC ... H10B 12/053; H10B 12/315; H10B 12/488
See application file for complete search history.

(56) References Cited

U.S. PATENT DOCUMENTS

| | | |
|---|---|---|
| 6,759,292 B2 | 7/2004 | Seitz et al. |
| 7,871,884 B2 | 1/2011 | Chien |
| 7,985,998 B2 | 7/2011 | Lin et al. |
| 8,193,067 B2 | 6/2012 | Anderson et al. |
| 8,492,820 B2 | 7/2013 | Anderson et al. |
| 8,547,729 B2 | 10/2013 | Huang |
| 9,129,991 B2 | 9/2015 | Rutter |
| 10,319,724 B2 | 6/2019 | Mathew et al. |
| 2006/0134877 A1 | 6/2006 | Goebel et al. |

(Continued)

FOREIGN PATENT DOCUMENTS

JP 2006-060137 A 3/2006

*Primary Examiner* — Steven M Page
(74) *Attorney, Agent, or Firm* — Harness, Dickey & Pierce, P.L.C.

(57) ABSTRACT

An integrated circuit device includes a substrate having a plurality of active regions defined therein, a first word line structure including a first word line, a first gate dielectric film surrounding the first word line, and an oxide semiconductor channel layer surrounding the first gate dielectric film, the first word line structure being buried in the substrate, and crossing a first active region of the plurality of active regions, a second word line structure including a second word line and a second gate dielectric film surrounding the second word line, the second word line structure being buried in the substrate and separated from the first word line structure, and crossing the first active region, a direct contact partially passing through the first active region and the first word line structure and contacting the oxide semiconductor channel layer, and a bit line contacting the direct contact.

20 Claims, 12 Drawing Sheets

100

(56)        References Cited

U.S. PATENT DOCUMENTS

2013/0214420  A1*    8/2013    Shimamoto ............ H10B 12/34
                                                                    257/773
2016/0322362  A1*   11/2016    Kim ..................... H10B 12/053
2020/0203351  A1*    6/2020    Chae .................... H10D 64/513
2020/0411528  A1    12/2020    Sung et al.
2021/0066305  A1*    3/2021    Kim ..................... H10B 12/485

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2022-0107177, filed on Aug. 25, 2022, in the Korean Intellectual Property Office, the disclosure of which is incorporated by reference herein in its entirety.

BACKGROUND

The inventive concepts relate to an integrated circuit device. More particularly, the inventive concepts relate to an integrated circuit device including a plurality of capacitor structures.

With the recent increase in the integration density of integrated circuit devices, there has been research into accommodating many components in a limited space. With the decrease in the critical dimension (CD) of contacts, which electrically connect many components of an integrated circuit device to each other, process cost and defective processes occur, and solutions thereto are being discussed.

SUMMARY

Some example embodiments provide an integrated circuit device having increased reliability.

According to an example embodiment of the inventive concepts, there is provided an integrated circuit device. The integrated circuit device includes a substrate having a plurality of active regions defined therein, a first word line structure including a first word line, a first gate dielectric film surrounding the first word line, and an oxide semiconductor channel layer surrounding the first gate dielectric film, the first word line structure being buried in the substrate, the first word line structure extending in a first horizontal direction, and the first word line structure crossing a first active region of the plurality of active regions, a second word line structure including a second word line and a second gate dielectric film surrounding the second word line, the second word line structure being buried in the substrate and the second word line structure separated from the first word line structure in a second horizontal direction that crosses the first horizontal direction, the second word line structure extending in the first horizontal direction, and the second word line structure crossing the first active region, a direct contact partially passing through the first active region and the first word line structure and contacting the oxide semiconductor channel layer, and a bit line extending in the second horizontal direction and contacting the direct contact.

According to another example embodiments of the inventive concepts, there is provided an integrated circuit device. The integrated circuit device includes a substrate having a plurality of active regions defined therein, a first word line structure including a first word line, a first gate dielectric film surrounding the first word line, and an oxide semiconductor channel layer surrounding the first gate dielectric film, the first word line structure being buried in the substrate, the first word line structure extending in a first horizontal direction, and the first word line structure crossing a first active region of the plurality of active regions, a second word line structure including a second word line and a second gate dielectric film surrounding the second word line, the second word line structure being buried in the substrate and the second word line structure separated from the first word line structure in a second horizontal direction that crosses the first horizontal direction, the second word line structure extending in the first horizontal direction, and the second word line structure crossing the first active region, a first capacitor structure buried in the substrate and connected to the first word line structure, the first capacitor structure being at a lower vertical level than the first word line structure, and a second capacitor structure on the substrate and connected to the second word line structure.

According to further example embodiments of the inventive concepts, there is provided an integrated circuit device. The integrated circuit device includes a substrate having a plurality of active regions defined therein, a plurality of first word line structures each including a first word line, a first gate dielectric film surrounding the first word line, and an oxide semiconductor channel layer surrounding the first gate dielectric film, the plurality of first word line structures being buried in the substrate, the plurality of first word line structures extending in a first horizontal direction, and the plurality of first word line structures crossing some of the plurality of active regions, a plurality of second word line structures each including a second word line and a second gate dielectric film surrounding the second word line, the plurality of second word line structures being buried in the substrate and separated from each of the plurality of first word line structures in a second horizontal direction that crosses the first horizontal direction, the plurality of second word line structures extending in the first horizontal direction, and the plurality of second word line structures crossing some of the plurality of active regions, a plurality of first capacitor structures buried in the substrate and respectively connected to the plurality of first word line structures, the plurality of first capacitor structures being at a lower vertical level than the plurality of first word line structures, a plurality of second capacitor structures on the substrate and respectively connected to the plurality of second word line structures, a plurality of direct contacts partially passing through the plurality of active regions, respectively, and the plurality of first word line structures, respectively, each of the plurality of direct contacts being in contact with the oxide semiconductor channel layer, and a plurality of capacitor contacts respectively contacting the plurality of active regions.

BRIEF DESCRIPTION OF THE DRAWINGS

Example embodiments will be more clearly understood from the following detailed description taken in conjunction with the accompanying drawings in which.

DETAILED DESCRIPTION OF THE EMBODIMENTS

Figure 1:
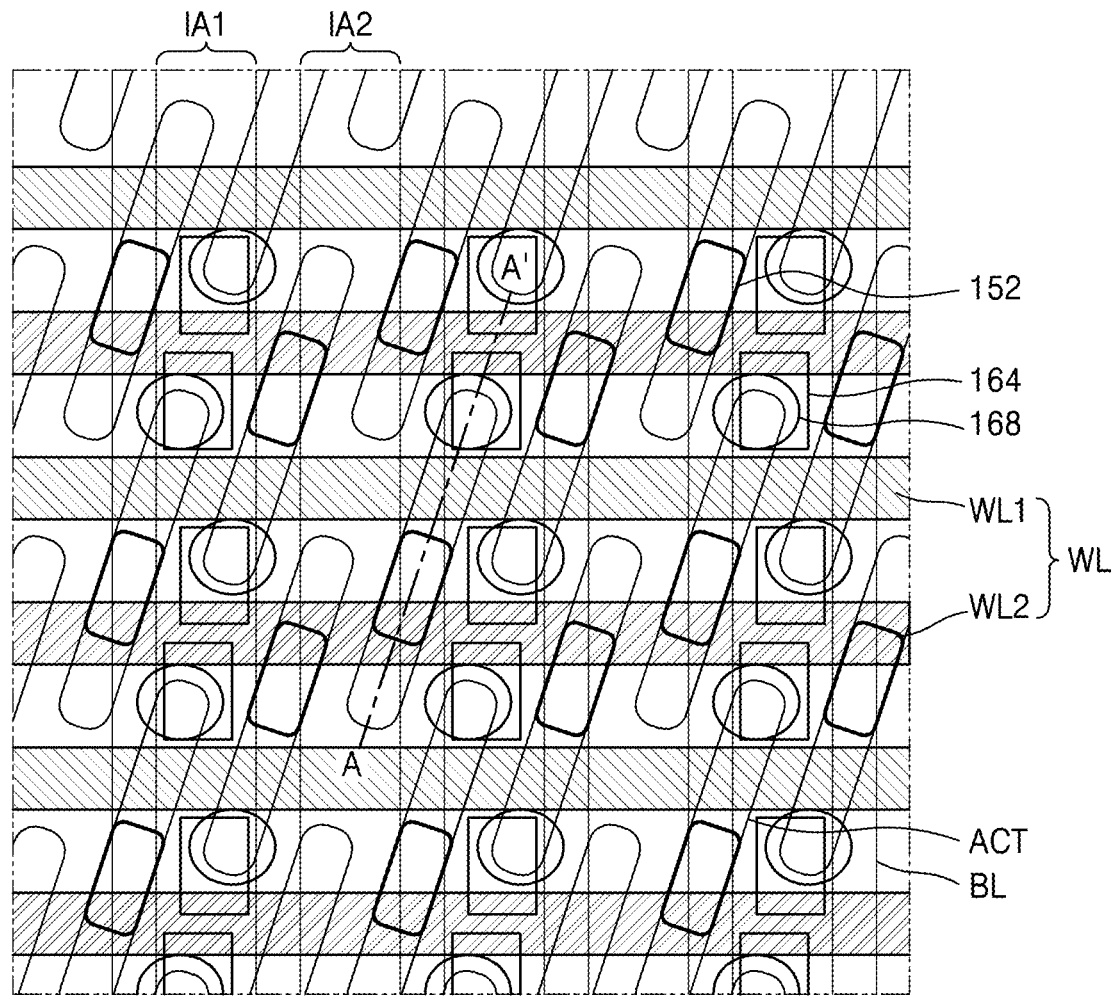
FIG. 1 is a schematic layout diagram of an integrated circuit device according to some example embodiments.
Figure 1:
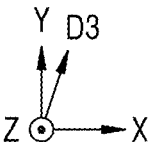

Hereinafter, some example embodiments are described in detail with reference to the accompanying drawings. In the drawings, like reference characters denote like elements, and redundant descriptions thereof are omitted.

FIG. 1 is a schematic layout diagram of an integrated circuit device 100 according to some example embodiments.

Referring to FIG. 1, the integrated circuit device 100 may include a plurality of active regions ACT. The active regions ACT may extend long in a third horizontal direction (a D3 direction), which intersects with a first horizontal direction (the X direction) and a second horizontal direction (the Y direction).

According to some example embodiments, a plurality of word lines WL may extend across the active regions ACT to be parallel with each other in the first horizontal direction (the X direction). According to some example embodiments, the word lines WL may include a first word line WL1 and a second word line WL2, which alternate with each other in the second horizontal direction (the Y direction) crossing the first horizontal direction (the X direction).

According to some example embodiments, a plurality of bit lines BL may extend over the word lines WL to be parallel with each other in the second horizontal direction (the Y direction). According to some example embodiments, each of (or alternatively, at least one of) the bit lines BL may be connected to an active region ACT through a direct contact 152.

According to some example embodiments, in a plan view, a plurality of isolation areas may be arranged among the bit lines BL. According to some example embodiments, in a plan view, the isolation areas may include a first isolation area IA1 including a capacitor contact 164 and a second isolation area IA2 not including the capacitor contact 164.

According to some example embodiments, a plurality of capacitor contacts 164 may be arranged in the first isolation area IA1 in line in the second horizontal direction (the Y direction). According to some example embodiments, a plurality of landing pads 168 may be respectively over the capacitor contacts 164. For example, at least a portion of each of (or alternatively, at least one of) the landing pads 168 may overlap with a capacitor contact 164 in a vertical direction (the Z direction).

Figure 2:
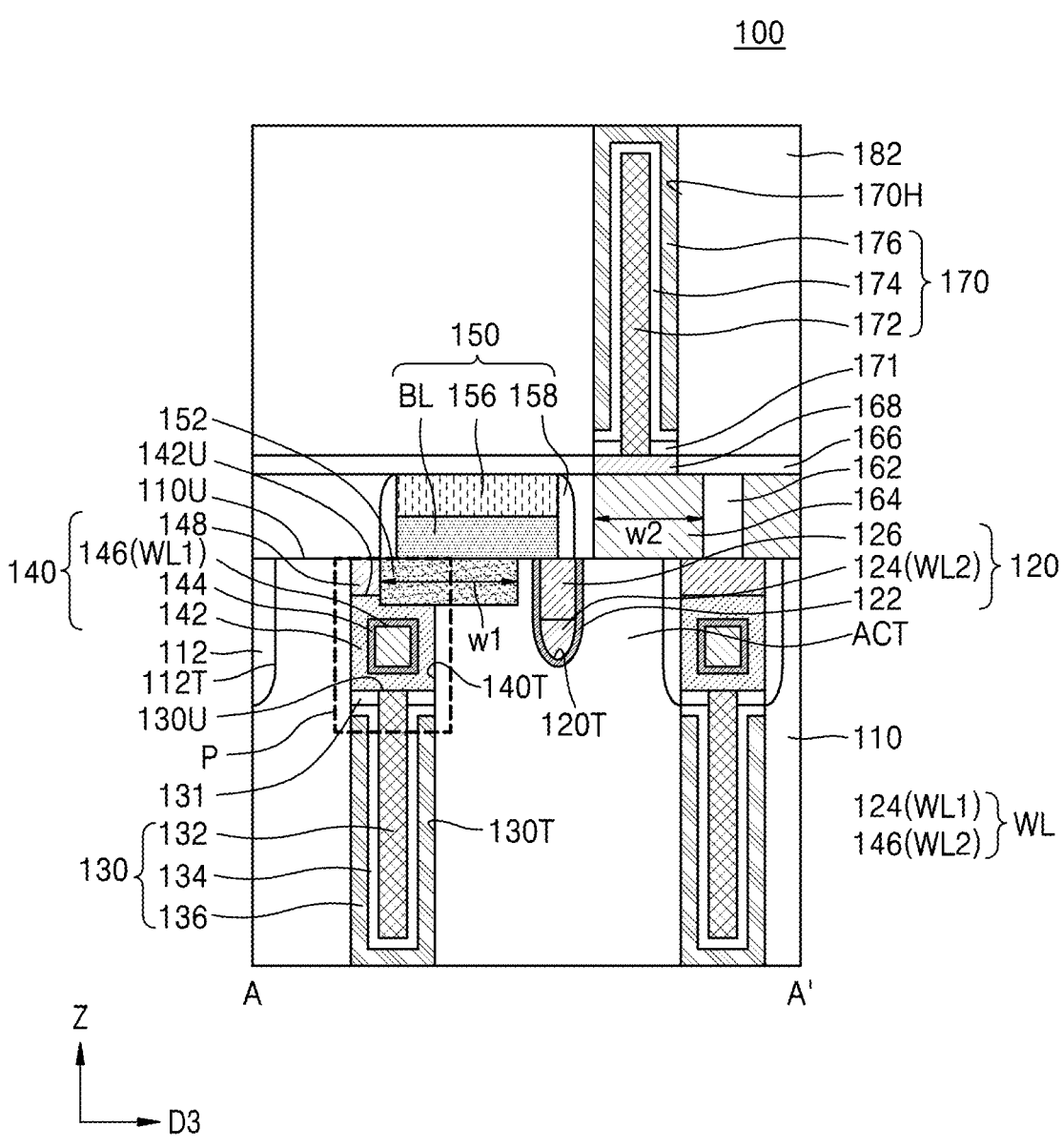
FIG. 2 is a cross-sectional view taken along line A-A' in FIG. 1.
Figure 3A:
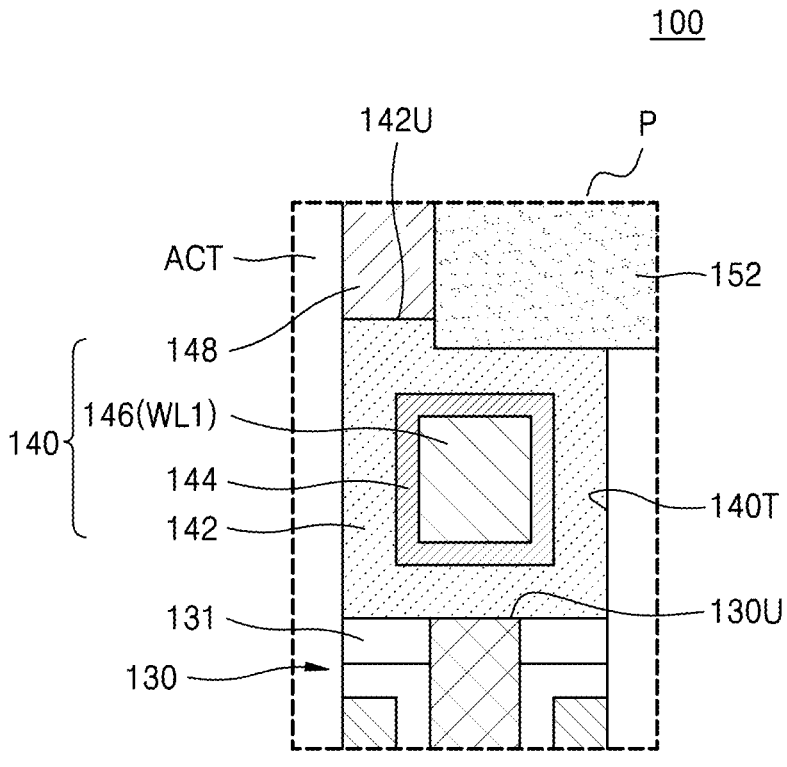
FIG. 3A is an enlarged view of a region P in FIG. 2.

FIG. 2 is a cross-sectional view taken along line A-A' in FIG. 1. FIG. 3A is an enlarged view of a region P in FIG. 2.

Referring to FIGS. 2 and 3A, the integrated circuit device 100 may include a substrate 110, in which the active regions ACT are defined by an isolation film 112. According to some example embodiments, the isolation film 112 may be in an isolation trench 112T formed in the substrate 110.

According to some example embodiments, the substrate 110 may include silicon including monocrystalline silicon, polycrystalline silicon, or amorphous silicon. According to some example embodiments, the substrate 110 may include at least one selected from the group consisting of Ge, SiGe, SiC, GaAs, InAs, and InP. Each of the terms "SiGe", "SiC", "GaAs", "InAs", and "InP" used herein indicates a material composed of elements included in each term and is not a chemical equation representing stoichiometric relationships. This may also be applied to terms used hereinbelow.

According to some example embodiments, the isolation film 112 may include an oxide film, a nitride film, or a combination thereof.

According to some example embodiments, a capacitor trench 130T may be formed in the substrate 110 to extend in the first horizontal direction (the X direction), and a plurality of first capacitor structures 130 may be arranged in the first horizontal direction (the X direction) in a lower portion of the capacitor trench 130T. For example, an isolation insulating film (not shown) may be between the first capacitor structures 130. According to some example embodiments, a first capacitor structure 130 may fill a portion of the capacitor trench 130T in the vertical direction (the Z direction), and a top surface 130U of the first capacitor structure 130 may be at a lower level than a top surface 110U of the substrate 110. For example, the first capacitor structure 130 may be buried in the substrate 110.

According to some example embodiments, a first word line trench 140T may be defined in a space of the capacitor trench 130T, which is not filled with the first capacitor structure 130, by respective portions of opposite side walls of the capacitor trench 130T and the top surface 130U of the first capacitor structure 130 in the substrate 110. According to some example embodiments, the first word line trench 140T may extend in the first horizontal direction (the X direction) over a plurality of first capacitor structures 130.

According to some example embodiments, a first word line structure 140 may be in the first word line trench 140T. For example, the first word line structure 140 may be buried in the substrate 110. According to some example embodiments, a first capacitor structure 130 may extend in the vertical direction (the Z direction) below the first word line structure 140. For example, the first word line structure 140 may overlap with the first capacitor structure 130 in the vertical direction (the Z direction). According to some example embodiments, the first capacitor structure 130 may be at a lower level than the first word line structure 140 in the vertical direction (the Z direction).

According to some example embodiments, the first capacitor structure 130 may include a first lower electrode 132 contacting the first word line structure 140, a first capacitor dielectric film 134 surrounding the first lower electrode 132, and a second lower electrode 136 separated from the first lower electrode 132 by the first capacitor dielectric film 134. According to some example embodiments, a lower dielectric film 131 may be between the first word line structure 140 and the first capacitor dielectric film 134. According to some example embodiments, the first lower electrode 132 may pass through the lower dielectric film 131 to be in contact with the first word line structure 140.

According to some example embodiments, the first lower electrode 132 and the second lower electrode 136 may include at least one material selected from the group consisting of (or alternatively, includes at least one of) metal, such as ruthenium (Ru), titanium (Ti), tantalum (Ta), niobium (Nb), iridium (Ir), molybdenum (Mo), and tungsten (W), conductive metal nitride, such as titanium nitride (TiN), tantalum nitride (TaN), niobium nitride (NbN), molybdenum nitride (MoN), and tungsten nitride (WN), and conductive metal oxide, such as iridium oxide (IrO), ruthenium oxide (RuO), and strontium ruthenium oxide (SrRuO). According to some example embodiments, the first capacitor dielectric film 134 and the lower dielectric film 131 may include at least one material selected from the group consisting of (or alternatively, including at least one of) zirconium oxide (ZrO), hafnium oxide (HfO), titanium oxide (TiO), niobium oxide (NbO), tantalum oxide (TaO), yttrium oxide (YO), strontium titanium oxide (SrTiO), barium strontium titanium oxide (BaSrTiO), scandium oxide (ScO), and lanthanum oxide (LaO).

According to some example embodiments, the first word line structure 140 may include a first gate electrode layer 146, a first gate dielectric film 144 surrounding the first gate electrode layer 146, an oxide semiconductor channel layer 142 surrounding the first gate dielectric film 144, and a first insulating capping layer 148 covering a top surface 142U of the oxide semiconductor channel layer 142. According to some example embodiments, the first gate electrode layer 146 may be separated from the oxide semiconductor channel layer 142 by the first gate dielectric film 144. According to some example embodiments, the oxide semiconductor channel layer 142 may be in contact with the first lower electrode 132. According to some example embodiments, the first gate electrode layer 146 may correspond to the first word line WL1.

Although it is illustrated in FIG. 2 that the first gate electrode layer 146 is at the center of the oxide semiconductor channel layer 142, example embodiments are not limited thereto. For example, the first gate electrode layer 146 may be closer to one of the opposite side walls of the first word line trench 140T than the other and closer to one of the first insulating capping layer 148 and the first capacitor structures 130 than the other. Although it is illustrated in FIG. 2 that the first gate electrode layer 146 has a rectangular cross-section, example embodiments are not limited thereto. For example, the first gate electrode layer 146 may have a partially truncated oval cross-section.

According to some example embodiments, the first gate electrode layer 146 may include Ti, TiN, Ta, TaN, W, WN, TiSiN, WSiN, or a combination thereof.

According to some example embodiments, the first gate dielectric film 144 may include at least one selected from the group consisting of (or alternatively, including at least one of) silicon oxide, silicon nitride, silicon oxynitride, oxide/nitride/oxide (ONO), and a high-k dielectric film having a higher dielectric constant than silicon oxide. The high-k dielectric film may include at least one material selected from the group consisting of (or alternatively, including at least one of) hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

According to some example embodiments, the oxide semiconductor channel layer 142 may include at least one material selected from the group consisting of (or alternatively, including at least one of) indium oxide (InO), zinc oxide (ZnO), tin oxide (SnO), gallium oxide (GaO), vanadium oxide (VO), titanium oxide (TiO), copper oxide (CuO), nickel oxide (NiO), copper aluminum oxide (CuAlO), and strontium copper oxide (SrCuO). According to some example embodiments, the oxide semiconductor channel layer 142 may include indium-gallium-zinc oxide (IGZO).

According to some example embodiments, the first insulating capping layer 148 may include a silicon oxide film, a silicon nitride film, a silicon oxynitride film, or a combination thereof.

According to some example embodiments, a second word line trench 120T may be separated from the first word line trench 140T in the second horizontal direction (the Y direction) and may extend in the first horizontal direction (the X direction). According to some example embodiments, a second word line structure 120 may be in the second word line trench 120T. For example, the second word line structure 120 may be buried in the substrate 110.

According to some example embodiments, the second word line structure 120 may include a second gate dielectric film 122, which conformally covers the second word line trench 120T, a second gate electrode layer 124, which is on the second gate dielectric film 122 and partially fills the second word line trench 120T, and a second insulating capping layer 126, which covers the second gate electrode layer 124.

According to some example embodiments, the second gate dielectric film 122 may include at least one selected from the group consisting of (or alternatively, including at least one of) silicon oxide, silicon nitride, silicon oxynitride, oxide/nitride/oxide (ONO), and a high-k dielectric film having a higher dielectric constant than silicon oxide. The high-k dielectric film may include at least one material selected from the group consisting of HfO, HfSiO, HfON, HfSiON, LaO, LaAlO, ZrO, ZrSiO, ZrON, ZrSiON, TaO, TiO, BaSrTiO, BaTiO, SrTiO, YO, AlO, and PbScTaO.

According to some example embodiments, the second gate electrode layer 124 may include Ti, TiN, Ta, TaN, W, WN, TiSiN, WSiN, or a combination thereof. According to some example embodiments, the second gate electrode layer 124 may correspond to the second word line WL2.

According to some example embodiments, the second insulating capping layer 126 may include a silicon oxide film, a silicon nitride film, a silicon oxynitride film, or a combination thereof.

According to some example embodiments, the first word line structure 140 may extend in the first horizontal direction (the X direction), and the second word line structure 120 may be separated from the first word line structure 140 in the second horizontal direction (the Y direction) and may extend in the first horizontal direction (the X direction). According to some example embodiments, a plurality of first word line structures 140 and a plurality of second word line structures 120 may alternate with each other in the second horizontal direction (the Y direction) and extend in the first horizontal direction (the X direction) to be parallel with each other.

Although it is illustrated in FIG. 2 that the first word line structure 140 has the same width in the second horizontal direction (the Y direction) as the second word line structure 120, example embodiments are not limited thereto. According to some example embodiments, the width in the second horizontal direction (the Y direction) of the first word line structure 140 may be greater than that of the second word line structure 120. According to some example embodiments, the width in the second horizontal direction (the Y direction) of the first word line structure 140 may be less than that of the second word line structure 120.

According to some example embodiments, the width in the second horizontal direction (the Y direction) of the first word line WL1 may be greater than that of the second word line WL2. According to some example embodiments, the width in the second horizontal direction (the Y direction) of the first word line WL1 may be less than that of the second word line WL2.

Although it is illustrated in FIG. 1 that a plurality of first word lines WL1 and a plurality of second word lines WL2 are evenly spaced, some example embodiments are not limited thereto. For example, two second word lines WL2 adjacent to a first word line WL1 may be separated from the first word line WL1 by different distances, respectively, in the second horizontal direction (the Y direction).

Although it is illustrated in FIG. 2 that the first word line WL1 is at the same level as the second word line WL2 in the vertical direction (the Z direction), some example embodiments are not limited thereto. According to some example embodiments, the first word line WL1 may be at a higher level than the second word line WL2 in the vertical direction (the Z direction). According to some example embodiments, the first word line WL1 may be at a lower level than the second word line WL2 in the vertical direction (the Z direction).

According to some example embodiments, a plurality of first word line structures 140 may cross portions of a plurality of active regions ACT, and a plurality of second word line structures 120 may cross portions of a plurality of active regions ACT. According to some example embodiments, a single active region ACT may be crossed by a single first word line structure 140 and a single second word line structure 120.

According to some example embodiments, the direct contact 152 may be in the substrate 110 and partially pass through the first word line structure 140 and the active region ACT. For example, the direct contact 152 may partially overlap with the first word line structure 140 and the active region ACT in the vertical direction (the Z direction). According to some example embodiments, the direct contact 152 may partially pass through the first insulating capping layer 148 and the oxide semiconductor channel layer 142.

According to some example embodiments, a portion of the direct contact 152 may be in contact with the oxide semiconductor channel layer 142, and another portion thereof may be in contact with the active region ACT. According to some example embodiments, each of (or alternatively, at least one of) a plurality of direct contacts 152 may be in contact with a single active region ACT.

According to some example embodiments, the integrated circuit device 100 may include the first capacitor structure 130 buried in the substrate 110 and thus not include, above the substrate 110, a contact structure for connecting the first word line structure 140 to the first capacitor structure 130. Accordingly, a horizontal width w1 of the direct contact 152 may increase, thereby securing a sufficient contact area. As a result, the reliability of the integrated circuit device 100 may increase.

According to some example embodiments, a plurality of bit line structures 150 may be on a plurality of direct contacts 152 and extend in the second horizontal direction (the Y direction) to be parallel with each other. According to some example embodiments, each of (or alternatively, at least one of) the bit line structures 150 may include a bit line BL contacting a direct contact 152, a third insulating capping layer 156 covering a top surface of the bit line BL, and a bit line spacer 158 covering each of (or alternatively, at least one of) the opposite side walls of the bit line BL and each of (or alternatively, at least one of) the opposite side walls of the third insulating capping layer 156.

According to some example embodiments, the direct contact 152 may include Si, Ge, W, WN, Co, Ni, Al, Mo, Ru, Ti, TiN, Ta, TaN, Cu, or a combination thereof. According to some example embodiments, the direct contact 152 may include doped polysilicon.

According to some example embodiments, the bit line BL may include doped polysilicon, Ti, TiN, TiSiN, W, WN, WSi, WSiN, Ru, or a combination thereof. According to some example embodiments, the third insulating capping layer 156 may include a silicon nitride film. According to some example embodiments, the bit line spacer 158 may include an oxide film, a nitride film, or a combination thereof.

According to some example embodiments, the opposite side walls of each bit line structure 150 may be covered with a first interlayer insulating film 162 on the substrate 110. According to some example embodiments, the capacitor contact 164 may be on the substrate 110 and pass through the first interlayer insulating film 162. For example, the capacitor contact 164 may be in contact with the active region ACT. According to some example embodiments, each of (or alternatively, at least one of) a plurality of capacitor contacts 164 may be in contact with a single active region ACT.

According to some example embodiments, a second interlayer insulating film 166 may cover the bit line structure 150, the first interlayer insulating film 162, and the capacitor contact 164. According to some example embodiments, a landing pad 168 may be on the capacitor contact 164 and pass through the second interlayer insulating film 166. For example, the landing pad 168 may be in contact with the capacitor contact 164.

According to some example embodiments, a second capacitor structure 170 may be on the landing pad 168. According to some example embodiments, the second capacitor structure 170 may be connected to the capacitor contact 164 through the landing pad 168. According to some example embodiments, when a gate voltage is applied to the second gate electrode layer 124, a channel region may be formed in the active region ACT surrounding the second word line structure 120. According to some example embodiments, the second capacitor structure 170 may be electrically connected to the second word line structure 120 through the landing pad 168, the capacitor contact 164, and the channel region.

According to some example embodiments, the second capacitor structure 170 may include a first upper electrode 172 contacting the landing pad 168, a second capacitor dielectric film 174 surrounding the first upper electrode 172, and a second upper electrode 176 separated from the first upper electrode 172 by the second capacitor dielectric film 174. According to some example embodiments, an upper dielectric film 171 may be between the landing pad 168 and the second capacitor dielectric film 174. For example, the first upper electrode 172 may pass through the upper dielectric film 171 to be in contact with the landing pad 168. According to some example embodiments, the second capacitor structure 170 may be surrounded by a third interlayer insulating film 182.

According to some example embodiments, each of (or alternatively, at least one of) the first interlayer insulating film 162, the second interlayer insulating film 166, and the third interlayer insulating film 182 may include an oxide film, a nitride film, or a combination thereof.

According to some example embodiments, the capacitor contact 164 may include doped polysilicon. According to some example embodiments, the landing pad 168 may include at least one material selected from the group consisting of (or alternatively, including at least one of) metal, such as Ru, Ti, Ta, Nb, Ir, Mo, and W, and conductive metal nitride, such as TiN, TaN, NbN, MoN, and WN.

According to some example embodiments, the first upper electrode 172 and the second upper electrode 176 may include at least one material selected from the group consisting of (or alternatively, including at least one of) metal, such as Ru, Ti, Ta, Nb, Ir, Mo, and W, conductive metal nitride, such as TiN, TaN, NbN, MoN, and WN, and conductive metal oxide, such as IrO, RuO, and SrRuO. According to some example embodiments, the second capacitor dielectric film 174 and the upper dielectric film 171 may include at least one material selected from the group consisting of (or alternatively, including at least one of) ZrO, HfO, TiO, NbO, TaO, YO, SrO, BaSrTiO, ScO, and LaO.

According to some example embodiments, the integrated circuit device 100 may include the first capacitor structure 130 buried in the substrate 110 such that a horizontal width w2 of the capacitor contact 164, which connects the second word line structure 120 to the second capacitor structure 170, may increase.

According to some example embodiments, a first active region selected from a plurality of active regions ACT may be crossed by a single first word line structure 140, and a second active region, which is selected from the active regions ACT and adjacent to the first active region, may be crossed by the first word line structure 140 crossing the first active region. In this case, the capacitor contact 164 contacting the second active region may extend on a portion of the first word line structure 140 crossing the first active region, the portion of the first word line structure 140 crossing the isolation film 112, thereby securing a sufficient contact area. As a result, the reliability of the integrated circuit device 100 may increase. For example, the capacitor contact 164 contacting the second active region may partially overlap in the vertical direction (the Z direction) with the first word line structure 140 crossing the first active region.

Figure 3B:
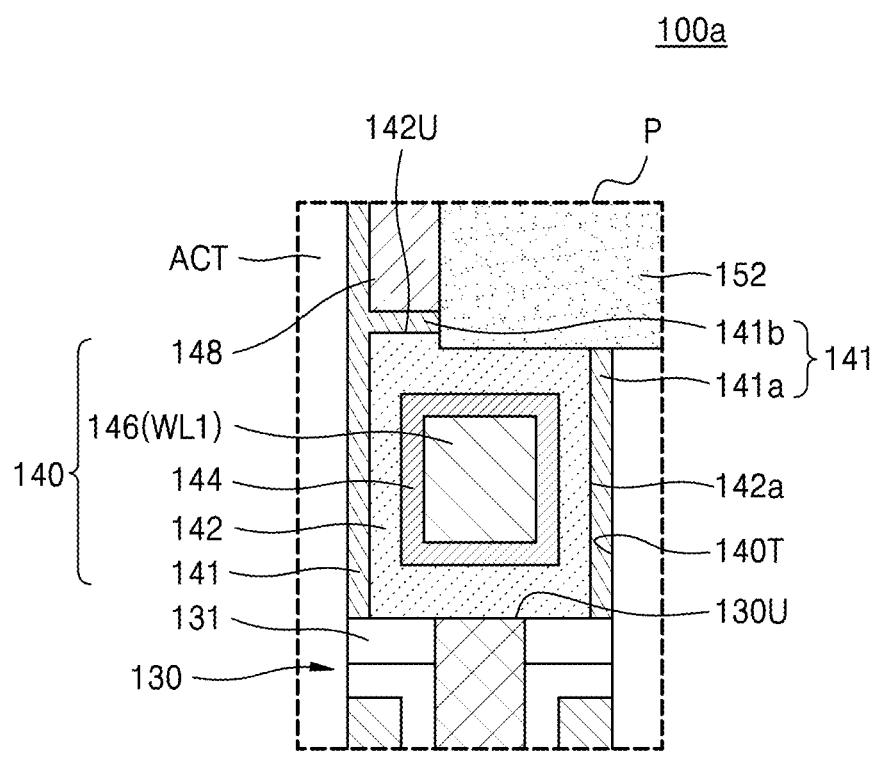
FIG. 3B is a cross-sectional view of an integrated circuit device according to some example embodiments and an enlarged view of a region corresponding to the region P in FIG. 2.

FIG. 3B is a cross-sectional view of an integrated circuit device 100*a* according to some example embodiments and is an enlarged view of a region corresponding to the region P in FIG. 2. The difference between FIG. 3A and FIG. 3B is whether the first word line structure 140 further includes an insulating barrier film 141.

Referring to FIG. 3B, the first word line structure 140 may further include the insulating barrier film 141. According to some example embodiments, the insulating barrier film 141 may include a first portion 141*a* covering opposite side walls of the first word line trench 140T and a second portion 141*b* between the oxide semiconductor channel layer 142 and the first insulating capping layer 148.

According to some example embodiments, the first portion 141*a* of the insulating barrier film 141 may cover opposite side walls 142*a* of the oxide semiconductor channel layer 142 and opposite side walls of the first insulating capping layer 148. According to some example embodiments, the second portion 141*b* of the insulating barrier film 141 may cover the top surface 142U of the oxide semiconductor channel layer 142. In this case, the top surface 142U of the oxide semiconductor channel layer 142 may face the first insulating capping layer 148 with the second portion 141*b* of the insulating barrier film 141 therebetween.

According to some example embodiments, the insulating barrier film 141 may be configured to prevent the electrical characteristics of the first word line structure 140 from degrading. For example, the insulating barrier film 141 may have a high-density membrane, thereby protecting the oxide semiconductor channel layer 142 from hydrogen atoms. According to some example embodiments, the insulating barrier film 141 may include at least one material selected from the group consisting of (or alternatively, including at least one of) AlO, silicon nitride (SiN), silicon boron nitride (SiBN), and silicon oxynitride (SiON). For example, the insulating barrier film 141 may include AlO.

According to some example embodiments, the direct contact 152 may partially pass through the insulating barrier film 141. For example, the direct contact 152 may pass through the second portion 141*b* of the insulating barrier film 141 to be in contact with the oxide semiconductor channel layer 142.

Figure 3C:
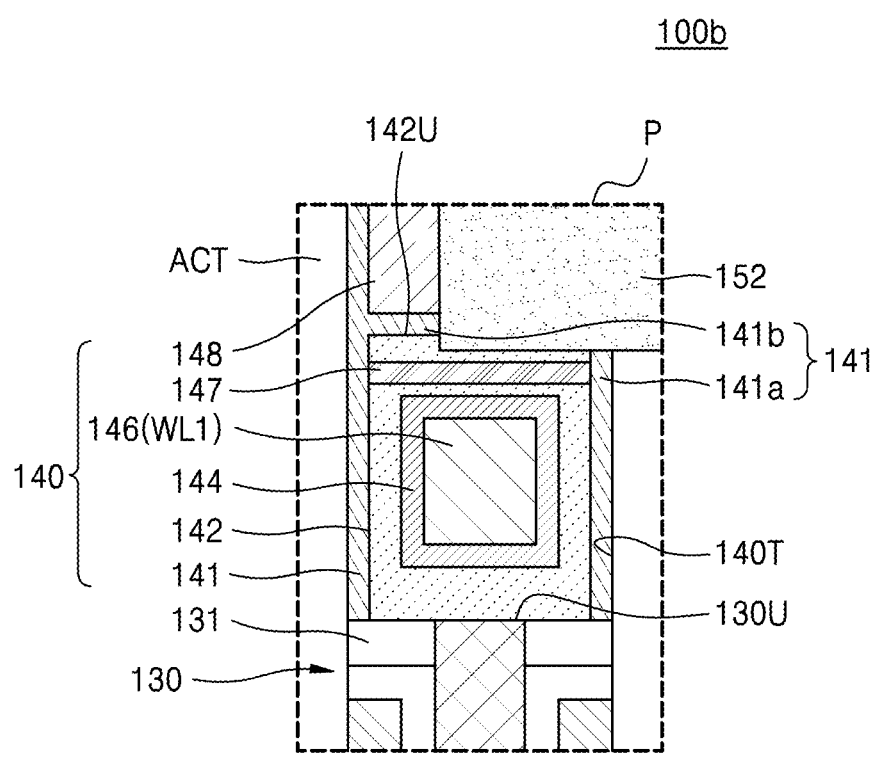
FIG. 3C is a cross-sectional view of an integrated circuit device according to some example embodiments and an enlarged view of a region corresponding to the region P in FIG. 2.

FIG. 3C is a cross-sectional view of an integrated circuit device 100*b* according to some example embodiments and an enlarged view of a region corresponding to the region P in FIG. 2. The difference between FIG. 3B and FIG. 3C is whether the first word line structure 140 further includes a conductive capping layer 147.

Referring to FIG. 3C, the first word line structure 140 may further include the conductive capping layer 147 between the first gate electrode layer 146 and the direct contact 152. Accordingly, the electrical reliability of the integrated circuit device 100*b* may increase.

According to some example embodiments, the conductive capping layer 147 may be in the oxide semiconductor channel layer 142. According to some example embodiments, the conductive capping layer 147 may be separated from the top surface 142U of the oxide semiconductor channel layer 142 in the vertical direction (the Z direction) and may be at a higher level than the first gate electrode layer 146 in the vertical direction (the Z direction). According to some example embodiments, the conductive capping layer 147 may be separated from the first gate electrode layer 146 by a portion of the oxide semiconductor channel layer 142 and the first gate dielectric film 144. According to some example embodiments, the direct contact 152 may be in contact with the oxide semiconductor channel layer 142 on the conductive capping layer 147.

According to some example embodiments, the conductive capping layer 147 may include doped polysilicon.

Although it is illustrated in FIG. 3C that the conductive capping layer 147 is separated from the first gate dielectric film 144 by the portion of the oxide semiconductor channel layer 142, some example embodiments are not limited thereto. For example, the conductive capping layer 147 may be in contact with the top surface of the first gate dielectric film 144.

Figure 3D:
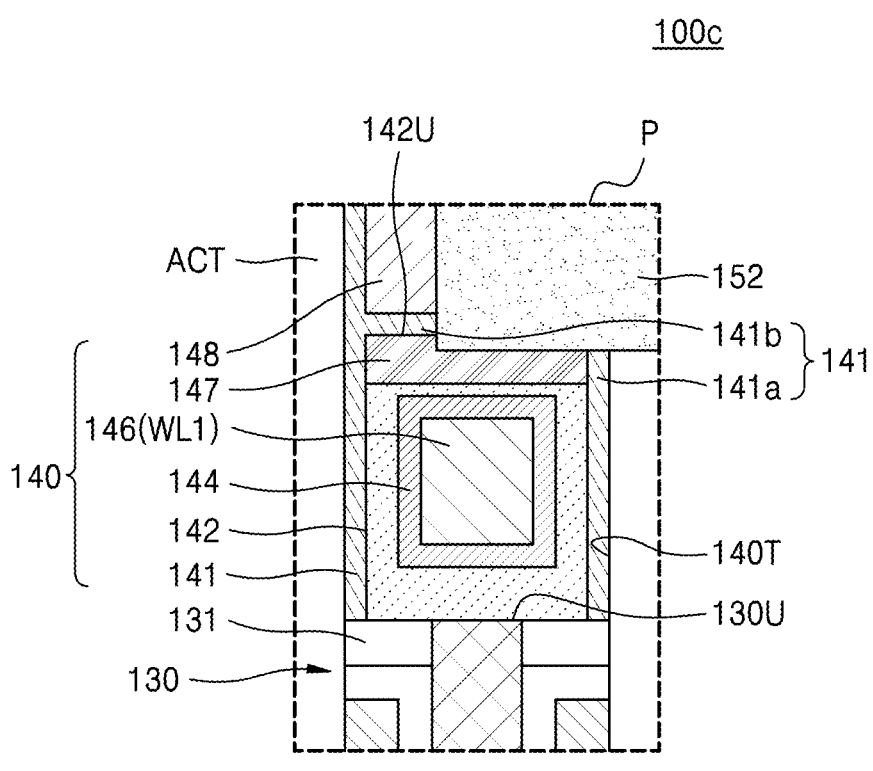
FIG. 3D is a cross-sectional view of an integrated circuit device according to some example embodiments and an enlarged view of a region corresponding to the region P in FIG. 2.

FIG. 3D is a cross-sectional view of an integrated circuit device 100*c* according to some example embodiments and an enlarged view of a region corresponding to the region P in FIG. 2. The difference between FIG. 3C and FIG. 3D is whether the conductive capping layer 147 covers the top surface 142U of the oxide semiconductor channel layer 142.

Referring to FIG. 3D, the conductive capping layer 147 may cover the top surface 142U of the oxide semiconductor channel layer 142. In this case, the first portion 141*a* of the insulating barrier film 141 may cover opposite side walls of the conductive capping layer 147, and the second portion 141*b* of the insulating barrier film 141 may cover the top surface of the conductive capping layer 147.

According to some example embodiments, the direct contact 152 may partially pass through the conductive capping layer 147. According to some example embodiments, the direct contact 152 may be in contact with the conductive capping layer 147 on the oxide semiconductor channel layer 142.

FIGS. 4A to 4F are cross-sectional views of sequential stages in a method of manufacturing the integrated circuit device 100, according to some example embodiments.

Figure 4A:
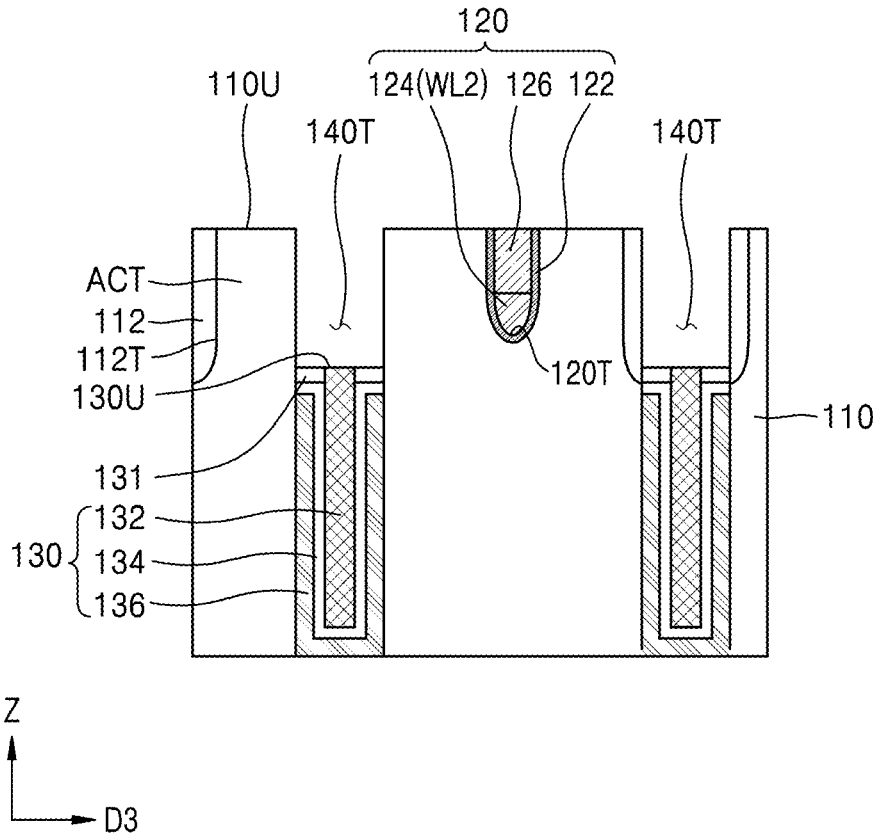
FIGS. 4A to 4F are cross-sectional views of sequential stages in a method of manufacturing an integrated circuit device, according to some embodiments.

Referring to FIG. 4A, the isolation trench 112T may be formed in the substrate 110 and filled with the isolation film 112 such that a plurality of active regions ACT may be defined. Thereafter, the second word line trench 120T may be formed in the substrate 110, and the second word line structure 120 may be formed in the second word line trench 120T. For example, after the second gate dielectric film 122 is conformally formed in the second word line trench 120T, the second gate electrode layer 124 and the second insulating capping layer 126 may be sequentially formed on the second gate dielectric film 122. For example, each of (or alternatively, at least one of) the second gate dielectric film 122, the second gate electrode layer 124, and the second insulating capping layer 126 may be formed by a physical vapor deposition (PVD) process, a chemical vapor deposition (CVD) process, or an atomic layer deposition (ALD) process.

Thereafter, the capacitor trench 130T may be formed in the substrate 110. For example, the capacitor trench 130T may be formed by a dry etching process. According to some example embodiments, a capacitor electrode (not shown) connected to a plurality of first capacitor structures 130 may be formed below the capacitor trench 130T. According to some example embodiments, a first capacitor structure 130 may be formed on the capacitor electrode and extend in the vertical direction (the Z direction) in the capacitor trench 130T. For example, the second lower electrode 136, the first capacitor dielectric film 134, and the lower dielectric film 131, and the first lower electrode 132 may be sequentially formed on the capacitor electrode.

For example, each of (or alternatively, at least one of) the first lower electrode 132 and the second lower electrode 136 may be formed by a PVD process, a CVD process, or a plating process. For example, the first capacitor dielectric film 134 may be formed by an ALD process, a CVD process, or a PVD process.

According to some example embodiments, the first capacitor structure 130 may partially fill the capacitor trench 130T, and the first word line trench 140T may be formed above the first capacitor structure 130 and the lower dielectric film 131.

Although it has been described above that the first capacitor structure 130 is formed after the isolation film 112 and the second word line structure 120 are sequentially formed, a manufacturing order is not limited thereto. For example, after the isolation film 112 is formed, the capacitor trench 130T and the first capacitor structure 130 may be formed, and then, the second word line trench 120T and the second word line structure 120 may be formed.

Figure 4B:
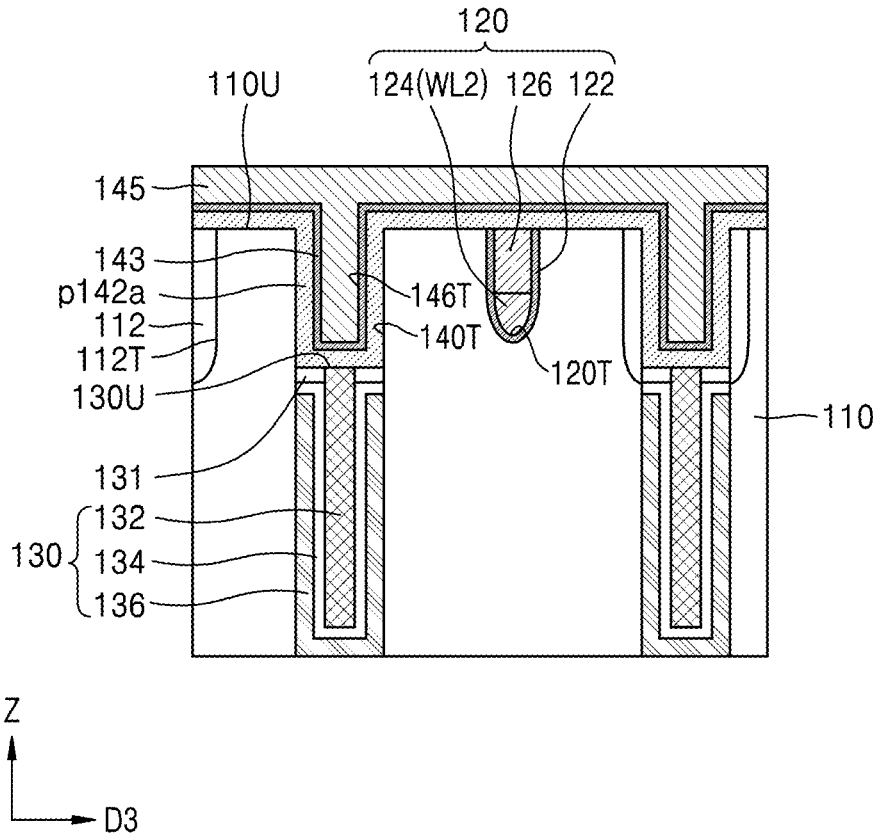

Referring to FIG. 4B, a first preliminary oxide semiconductor channel layer p142*a*, a preliminary gate dielectric film 143, and a preliminary gate electrode layer 145 may be sequentially formed on the substrate 110.

According to some example embodiments, the first preliminary oxide semiconductor channel layer p142*a* may be formed to conformally cover the opposite side walls of the first word line trench 140T, the top surface 130U of the first capacitor structure 130, and the top surface 110U of the substrate 110. Thereafter, the preliminary gate dielectric film 143 may be formed to conformally cover the first preliminary oxide semiconductor channel layer p142*a*. For example, the first preliminary oxide semiconductor channel layer p142*a* and the preliminary gate dielectric film 143 may partially fill the first word line trench 140T, thereby forming a gate trench 146T. Thereafter, the preliminary gate electrode layer 145 filling the gate trench 146T may be formed on the preliminary gate dielectric film 143.

Figure 4C:
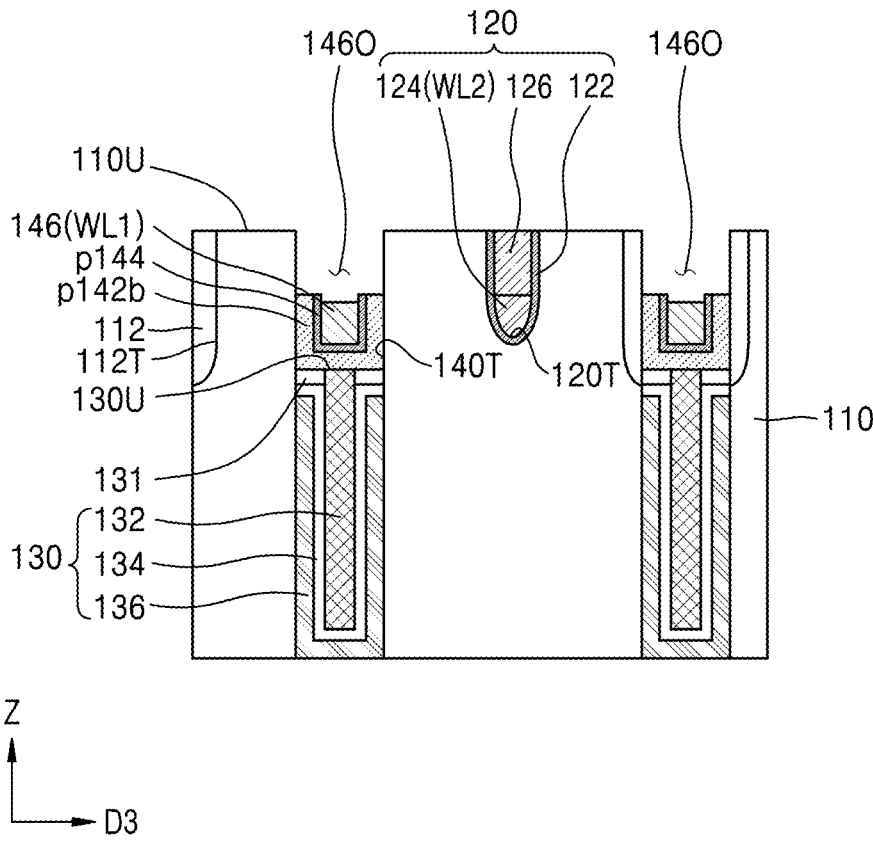

Referring to FIGS. 4B and 4C, the first gate electrode layer 146, a second preliminary oxide semiconductor channel layer p142*b*, and a preliminary gate dielectric film may be formed by partially removing the preliminary gate electrode layer 145, the preliminary gate dielectric film 143, and the first preliminary oxide semiconductor channel layer p142*a* by using an etching process. In this case, the first gate electrode layer 146 may be exposed by a gate opening 1460.

Figure 4D:
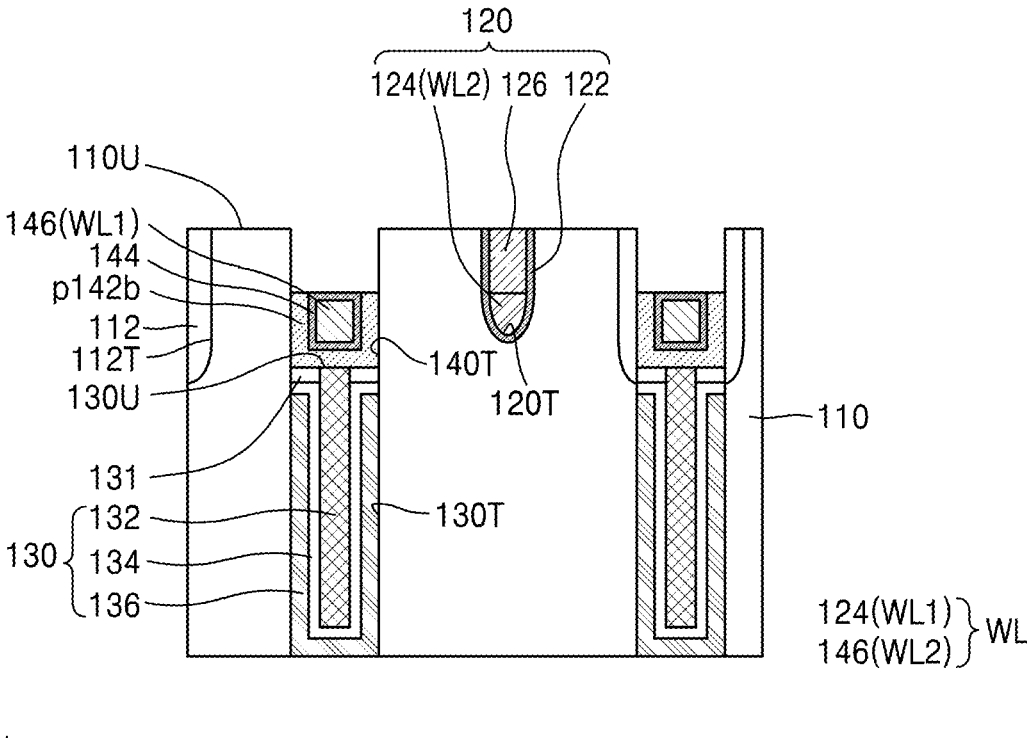

Referring to FIGS. 4C and 4D, the first gate dielectric film 144 surrounding the first gate electrode layer 146 may be formed by vapor depositing a gate dielectric film material on the first gate electrode layer 146 through an ALD process, a CVD process, a PVD process, or the like and then performing an etch back process on the gate dielectric film material. For example, the second preliminary oxide semiconductor channel layer p142*b* may surround the side and bottom portions of the first gate dielectric film 144.

Figure 4E:
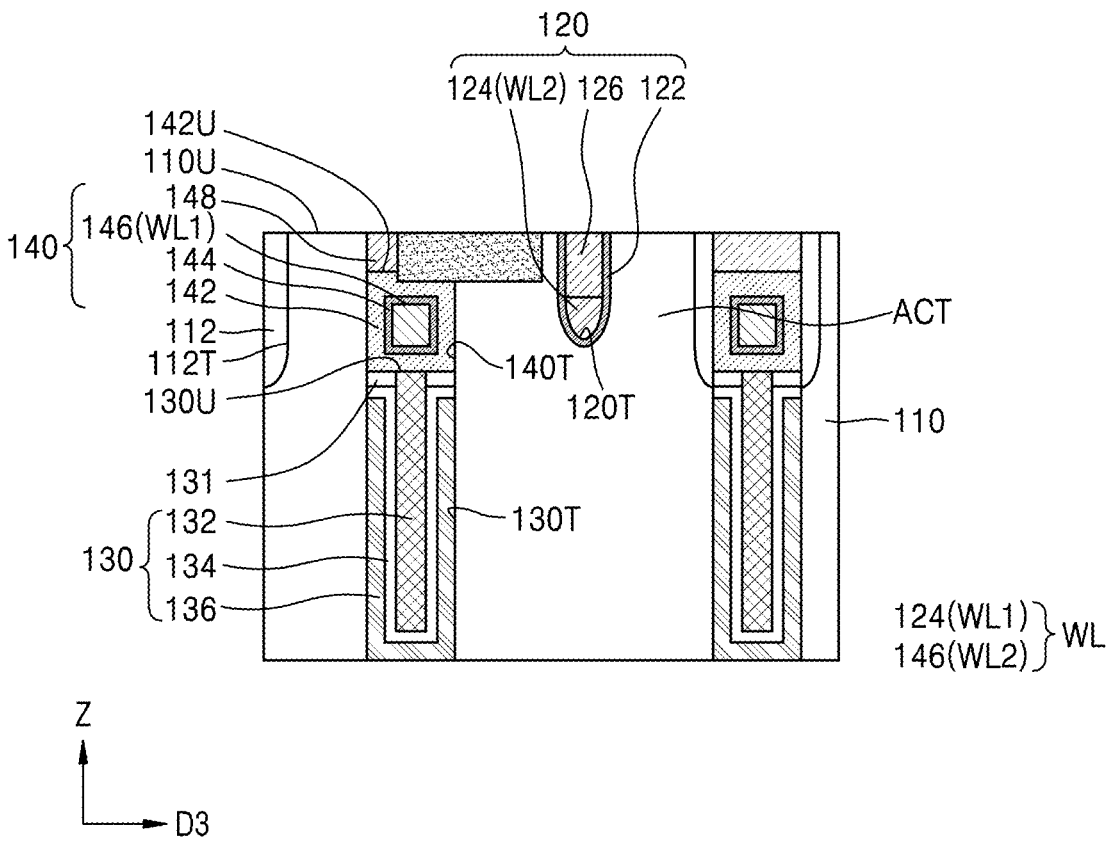

Referring to FIGS. 4D and 4E, the oxide semiconductor channel layer 142 may be formed by vapor depositing an oxide semiconductor material on the second preliminary oxide semiconductor channel layer p142*b* and the first gate dielectric film 144 through an ALD process, a CVD process, a PVD process, or the like.

Thereafter, the first insulating capping layer 148 may be formed on the oxide semiconductor channel layer 142. For example, the first insulating capping layer 148 may cover the top surface 142U of the oxide semiconductor channel layer 142 and fill the remaining portion of the first word line trench 140T. Thereafter, the direct contact 152 may be formed to partially pass through an active region ACT and the first word line structure 140, and the bit line structure 150 may be formed on the direct contact 152.

According to some example embodiments, a direct contact trench, which partially passes through the active region ACT and the first word line structure 140, may be formed by a dry etching process. The direct contact 152 filling the direct contact trench may be formed by an ALD process, a CVD process, a PVD process, or the like.

Figure 4F:
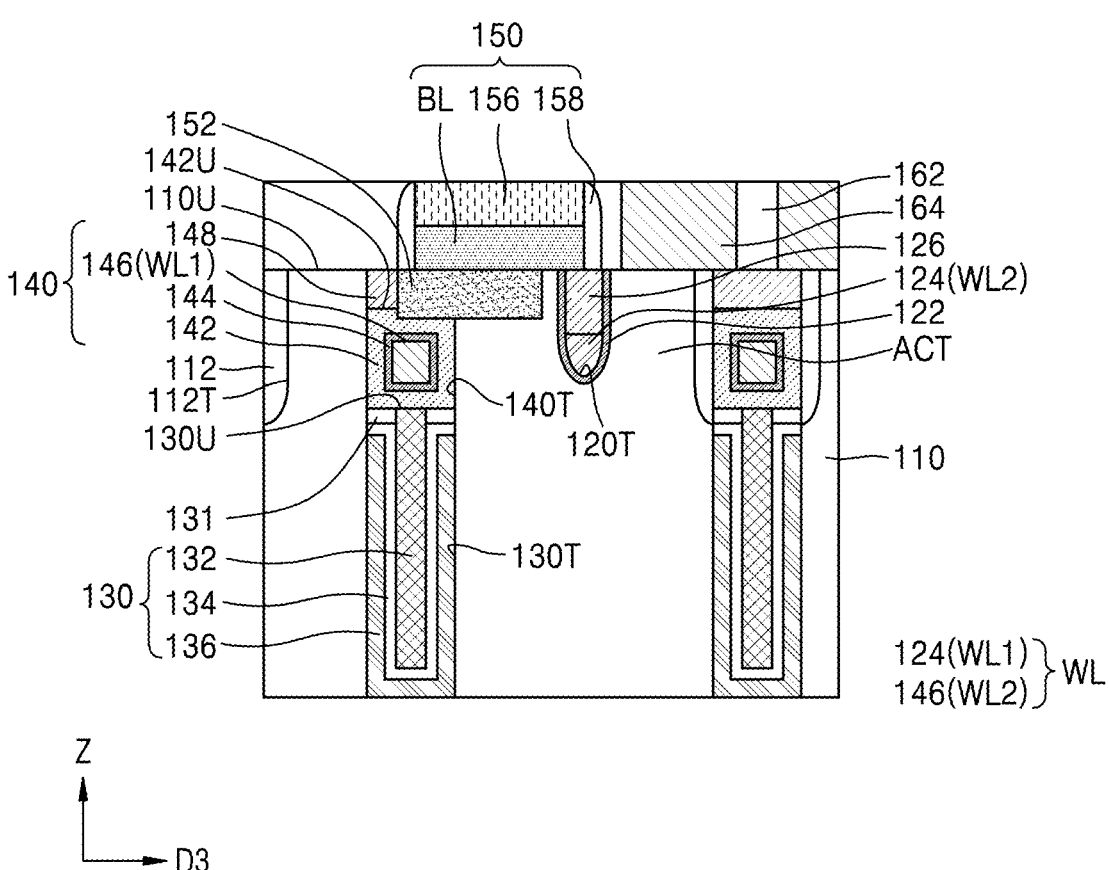

Referring to FIG. 4F, the bit line BL and the third insulating capping layer 156 may be formed by sequentially applying a conductive material for the bit line BL and an insulating material for the third insulating capping layer 156 to the substrate 110 and then performing an etching process on a resultant structure of FIG. 4E. For example, the top surface 110U of the substrate 110 in the first and second isolation areas IA1 and IA2 (see FIG. 1) may be exposed by the etching process. Thereafter, the bit line spacer 158 covering each of (or alternatively, at least one of) the opposite side walls of the bit line BL and each of (or alternatively, at least one of) the opposite side walls of the third insulating capping layer 156 may be formed. For example, the bit line spacer 158 may be formed by a vapor deposition process, such as an ALD process, a CVD process, or a PVD process, and an etch back process. Thereafter, the first interlayer insulating film 162 may be formed in the first and second isolation areas IA1 and IA2 and cover the top surface 110U of the substrate 110 and the opposite side walls of the bit line structure 150.

Referring to FIGS. 2 and 4F, the capacitor contact 164 may be formed to pass through the first interlayer insulating film 162. For example, a capacitor contact hole may be formed by an etching process to pass through the first interlayer insulating film 162 and partially expose the top surface 110U of the substrate 110 and the top surface of the second word line structure 120. Thereafter, the capacitor contact 164 filling the capacitor contact hole may be formed by an ALD process, a CVD process, a PVD process, a plating process, or the like.

Thereafter, the second interlayer insulating film 166 may be formed to cover the bit line structure 150, the first interlayer insulating film 162, and the capacitor contact 164. The landing pad 168 may be formed to pass through the second interlayer insulating film 166 and contact the capacitor contact 164. The landing pad 168 may be formed by an ALD process, a CVD process, a PVD process, a plating process, or the like.

Thereafter, the third interlayer insulating film 182 may be formed on the second interlayer insulating film 166 and the landing pad 168, and a capacitor hole 170H may be formed by an etching process to expose the landing pad 168. Thereafter, the second capacitor structure 170 may be formed in the capacitor hole 170H. For example, the upper dielectric film 171, the first upper electrode 172 contacting the landing pad 168, and the second capacitor dielectric film 174 covering the first upper electrode 172 may be formed in the capacitor hole 170H, and then, the second upper electrode 176 may be formed on the second capacitor dielectric film 174.

For example, each of (or alternatively, at least one of) the first upper electrode 172 and the second upper electrode 176 may be formed by a PVD process, a CVD process, a plating process, or the like. For example, the second capacitor dielectric film 174 may be formed by an ALD process, a CVD process, a PVD process, or the like.

While the inventive concepts has been particularly shown and described with reference to example embodiments thereof, it will be understood that various changes in form and details may be made therein without departing from the spirit and scope of the following claims.

What is claimed is:

1. An integrated circuit device comprising:
a substrate having a plurality of active regions defined therein;
a first word line structure including a first word line, a first gate dielectric film surrounding the first word line, and an oxide semiconductor channel layer surrounding the first gate dielectric film, the first word line structure being buried in the substrate, the first word line structure extending in a first horizontal direction, and the first word line structure crossing a first active region of the plurality of active regions;
a second word line structure including a second word line and a second gate dielectric film surrounding the second word line, the second word line structure being buried in the substrate and separated from the first word line structure in a second horizontal direction that crosses the first horizontal direction, the second word line structure extending in the first horizontal direction, and the second word line structure crossing the first active region;
a direct contact partially passing through the first active region and the first word line structure and contacting the oxide semiconductor channel layer; and
a bit line extending in the second horizontal direction and contacting the direct contact.

2. The integrated circuit device of claim 1, wherein the first word line structure further includes an insulating barrier film covering a side wall of the oxide semiconductor channel layer.

3. The integrated circuit device of claim 2, wherein the insulating barrier film includes aluminum oxide.

4. The integrated circuit device of claim 1, wherein the first word line structure further includes a conductive capping layer on the oxide semiconductor channel layer, the conductive capping layer being separated from the first word line by the oxide semiconductor channel layer in a vertical direction.

5. The integrated circuit device of claim 4, wherein the direct contact is in contact with the conductive capping layer.

6. The integrated circuit device of claim 4, wherein the conductive capping layer includes doped polysilicon.

7. The integrated circuit device of claim 1, wherein the direct contact overlaps with the first word line in a vertical direction.

8. The integrated circuit device of claim 1, further comprising:
a plurality of capacitor contacts respectively contacting the plurality of active regions;
a first capacitor structure extending in the substrate in a vertical direction, the first capacitor structure being at a lower level than the first word line structure in the vertical direction and the first capacitor structure being connected to the oxide semiconductor channel layer; and
a second capacitor structure extending on the substrate in the vertical direction, the second capacitor structure being at a higher level than the second word line structure in the vertical direction, and the second capacitor structure being connected to a capacitor contact of the plurality of capacitor contacts.

9. The integrated circuit device of claim 8, wherein the plurality of capacitor contacts include a first capacitor contact and a second capacitor contact, the first capacitor contact being in contact with the first active region, and the second capacitor contact being separated from the first active region in the first horizontal direction and the second capacitor contact being in contact with a second active region adjacent to the first active region, wherein the second capacitor contact overlaps with the first word line structure in the vertical direction.

10. The integrated circuit device of claim 1, wherein the first word line structure further includes an insulating capping layer covering a top surface of the oxide semiconductor channel layer.

11. An integrated circuit device comprising:
a substrate having a plurality of active regions defined therein;
a first word line structure including a first word line, a first gate dielectric film surrounding the first word line, and an oxide semiconductor channel layer surrounding the first gate dielectric film, the first word line structure being buried in the substrate, the first word line structure extending in a first horizontal direction, and the first word line structure crossing a first active region of the plurality of active regions;
a second word line structure including a second word line and a second gate dielectric film surrounding the second word line, the second word line structure being buried in the substrate and separated from the first word line structure in a second horizontal direction that crosses the first horizontal direction, the second word line structure extending in the first horizontal direction, and the second word line structure crossing the first active region;

a first capacitor structure buried in the substrate and connected to the first word line structure, the first capacitor structure being at a lower vertical level than the first word line structure; and a second capacitor structure on the substrate and connected to the second word line structure.

12. The integrated circuit device of claim 11, further comprising:

a direct contact partially passing through the first word line structure and the first active region and contacting the oxide semiconductor channel layer.

13. The integrated circuit device of claim 12, wherein the first word line structure further includes a barrier film surrounding a side wall and a top surface of the oxide semiconductor channel layer, and the direct contact passes through the barrier film.

14. The integrated circuit device of claim 12, wherein the first word line structure further includes a conductive capping layer over the first word line, the conductive capping layer being separated from the first word line by the oxide semiconductor channel layer.

15. The integrated circuit device of claim 14, wherein the direct contact is in contact with the conductive capping layer.

16. The integrated circuit device of claim 11, wherein the oxide semiconductor channel layer includes indium-gallium-zinc oxide (IGZO).

17. An integrated circuit device comprising:

a substrate having a plurality of active regions defined therein;

a plurality of first word line structures each including a first word line, a first gate dielectric film surrounding the first word line, and an oxide semiconductor channel layer surrounding the first gate dielectric film, the plurality of first word line structures being buried in the substrate, the plurality of first word line structures extending in a first horizontal direction, and the plurality of first word line structures crossing some of the plurality of active regions;

a plurality of second word line structures each including a second word line and a second gate dielectric film surrounding the second word line, the plurality of second word line structures being buried in the substrate and separated from each of the plurality of first word line structures in a second horizontal direction that crosses the first horizontal direction, the plurality of second word line structures extending in the first horizontal direction, and the plurality of second word line structures crossing some of the plurality of active regions;

a plurality of first capacitor structures buried in the substrate and respectively connected to the plurality of first word line structures, the plurality of first capacitor structures being at a lower vertical level than the plurality of first word line structures;

a plurality of second capacitor structures on the substrate and respectively connected to the plurality of second word line structures;

a plurality of direct contacts partially passing through the plurality of active regions, respectively, and the plurality of first word line structures, respectively, each of the plurality of direct contacts being in contact with the oxide semiconductor channel layer; and a plurality of capacitor contacts respectively contacting the plurality of active regions.

18. The integrated circuit device of claim 17, wherein the plurality of capacitor contacts include a first capacitor contact and a second capacitor contact, the first capacitor contact being in contact with a first active region of the plurality of active regions, and the second capacitor contact being separated from the first active region in the first horizontal direction and being in contact with a second active region adjacent to the first active region, and the second capacitor contact vertically overlaps with a first word line structure crossing the first active region among the plurality of first word line structures.

19. The integrated circuit device of claim 17, wherein each of the plurality of first word line structures further includes a barrier film covering a side wall of the oxide semiconductor channel layer.

20. The integrated circuit device of claim 17, wherein each of the plurality of first word line structures further includes a conductive capping layer covering a top surface of the oxide semiconductor channel layer, and the conductive capping layer is in contact with a direct contact of the plurality of direct contacts.

* * * * *